United States Patent [19]

Lee et al.

[11] Patent Number: 5,604,138
[45] Date of Patent: Feb. 18, 1997

[54] PROCESS FOR MAKING A SEMICONDUCTOR MOS TRANSISTOR

[75] Inventors: Chang-Jae Lee; Young-Jin Song, both of Chungcheongbuk-do, Rep. of Korea

[73] Assignee: Goldstar Electron Co., Ltd., Cheongju, Rep. of Korea

[21] Appl. No.: 357,961

[22] Filed: Dec. 15, 1994

[30] Foreign Application Priority Data

Dec. 16, 1993 [KR] Rep. of Korea ............... 93-28013

[51] Int. Cl.$^6$ ............................................... H01L 21/8234
[52] U.S. Cl. .............................. 437/41; 437/44; 437/200
[58] Field of Search ................................. 437/44, 416 S, 437/40 GS, 200

[56] References Cited

U.S. PATENT DOCUMENTS 5,208,476  5/1993  Inoue ........................................... 257/408

FOREIGN PATENT DOCUMENTS

| 62-285468A | 12/1987 | Japan | 437/44 |
| 298142A | 4/1990 | Japan | 437/44 |
| 2162737A | 6/1990 | Japan | 437/44 |
| 476925A | 3/1992 | Japan | 437/44 |

OTHER PUBLICATIONS

Wolf et al., "Silicon Processing for the VLSI Era vol. I: Process Technology", Lattice Press, 1986, pp. 384–385.
Ghandhi, "VLSI Fabrication Principles Silicon and Gallium Arsenide", John Wiley & Sons, 1983, pp. 327–328, 522–524.

*Primary Examiner*—John Niebling
*Assistant Examiner*—Richard A. Booth
*Attorney, Agent, or Firm*—Alan R. Loudermilk

[57] ABSTRACT

A process for forming an MOS semiconductor device having an LDD structure is disclosed, which may include the steps of: forming a first insulating layer on a semiconductor substrate; forming a conductive layer on the first insulating layer; forming a second insulating layer on the conductive layer; forming a third insulating layer on the second insulating layer; forming an etch inhibiting layer pattern for forming an over-sized gate on a relevant area of the second insulating layer; removing the second and third insulating layers and the conductive layer excluding the portions protected from the etch inhibiting layer, so as to form a stacked pattern consisting of the residual second insulating layer/the third insulating layer/the conductive layer; forming a first impurity ion buried layer on a relevant portion of the semiconductor substrate utilizing the stacked pattern for formation of a source/drain region; removing the etch inhibiting layer; removing an edge portion of the remaining second insulating layer of the stacked pattern for forming the final gate; removing the residual third insulating layer of the stacked pattern; etching the residual conductive layer by using the partly removed second insulating layer as the mask to form the final gate; forming a second impurity ion buried layer on the relevant portion of the semiconductor substrate for forming the LDD structure; forming a fourth insulating layer on the whole surface of the wafer; and activating the first and second ion buried layers.

21 Claims, 8 Drawing Sheets

FIG. 4 PRIOR ART
DEPENDENCE OF JUNCTION LEAKAGE ON CLEANING METHODS

| ETCH | CLEANING METHOD | JUNCTION LEAKAGE (nA AT 3.3V) |
|---|---|---|
| DRY + WET ETCH | SC1 + HF | 4.1 |
| 10% OVER ETCH | SC1 + HF | 6.4 |
| 30% OVER ETCH | SC1 + HF | 60.0 |
| 30% OVER ETCH | SILICON LIGHT ETCH + SC1 + HF | 4.0 |

PROCESS FOR MAKING A SEMICONDUCTOR MOS TRANSISTOR

FIELD OF THE INVENTION

The present invention relates to processes for making semiconductor devices, and more particularly to processes for forming MOS field effect transistors (FETs) having a lightly doped drain (LDD) in a high density device.

BACKGROUND OF THE INVENTION

Generally, a semiconductor integrated circuit requires high circuit performance and high density. Therefore, in the case of a metal oxide semiconductor field effect transistor (or "MOSFET"), the technology for the forming a semiconductor integrated circuit has been scaled down to a sub-micron range as a result of the efforts to reduce the size of the device. Only through a reduction of the horizontal dimension and a proportionate reduction of the vertical dimension, can a functional equilibrium between various devices be achieved. That is, if the distance between the source and drain is reduced as a result of the reduction of the size of the device, an undesirable variation of the characteristics of the device occurs, a typical example being the short channel effect. If this short channel effect is to be overcome, a horizontal scale-down has to be carried out; that is, the gate length has to be reduced. Further, a vertical scale-down has to be carried out; that is, the thickness of the gate insulation dielectrics and the depth of the junction and the like have to be reduced. Further, the applied voltage has to be lowered, and the doping concentration of the semiconductor substrate has to be increased. Particularly, the doping profile for the ion implantation depth of the channel region has to be controlled. The applied voltage for the semiconductor device, however, has to satisfy the power source for the electronic apparatus in which the semiconductor device is used. Therefore, while the dimension of the semiconductor device is scaled down, the electrical dimension for the applied power source of the circuit is not reduced. In the case of a MOS device, particularly in the case of an NMOS transistor, the distance between the source and drain is reduced as a result of the reduction of the channel. Accordingly, the electrons which are supplied from the source are abruptly accelerated by a high electric field near a pinch-off region near the channel of the drain junction, thereby producing hot carriers. Thus, the NMOS transistor is vulnerable to these hot carriers. (Refer to Chenming Huet et al, "Hot-electron-induced MOSFET Degradation Motel, Monitor and Improvement", IEEE Transactions on Electron Devices, Vol. ED-32, No. 2, February 1985, pp. 375–385).

According to the above cited paper, the instability of hot carriers is caused by a high electric field near the drain junction, which is caused by the short channel length and the high applied voltage. Hot carriers thus generated are injected into the gate insulating layer, which can result in substrate current. Therefore, an LDD (lightly doped drain) structure was proposed in 1978, which improves the NMOS device which is subject to hot carriers and has a reduced channel length. (Refer to K. Saito et al, "A New Short Channel MOSFET with Lightly Doped Drain", denshi tsushin rengo taikai (in Japanese), April 1978, p. 220).

The LDD structure has characteristics such that the side length is narrow, and a self-aligned lightly doped $n^-$ region is disposed between the channel and the highly doped $n^+$ source/drain region. This $n^-$ lightly doped region spreads out the high electric field near the drain junction, so that carrier electrons supplied from the source are not abruptly accelerated, thereby overcoming the current instability due to hot carriers. Since studies on semiconductor devices of over 1 mega-bit DRAMs have begun, techniques for manufacturing MOSFETs having an LDD structure have been proposed in various forms. Of them, the most typical one is that in which the LDD is formed by providing a side wall spacer on each of the side walls of the gate, and this technique is being used in most mass production devices.

FIG. 1 illustrates a conventional process for forming an NMOS transistor having an LDD structure.

Figures 1A, 1B:
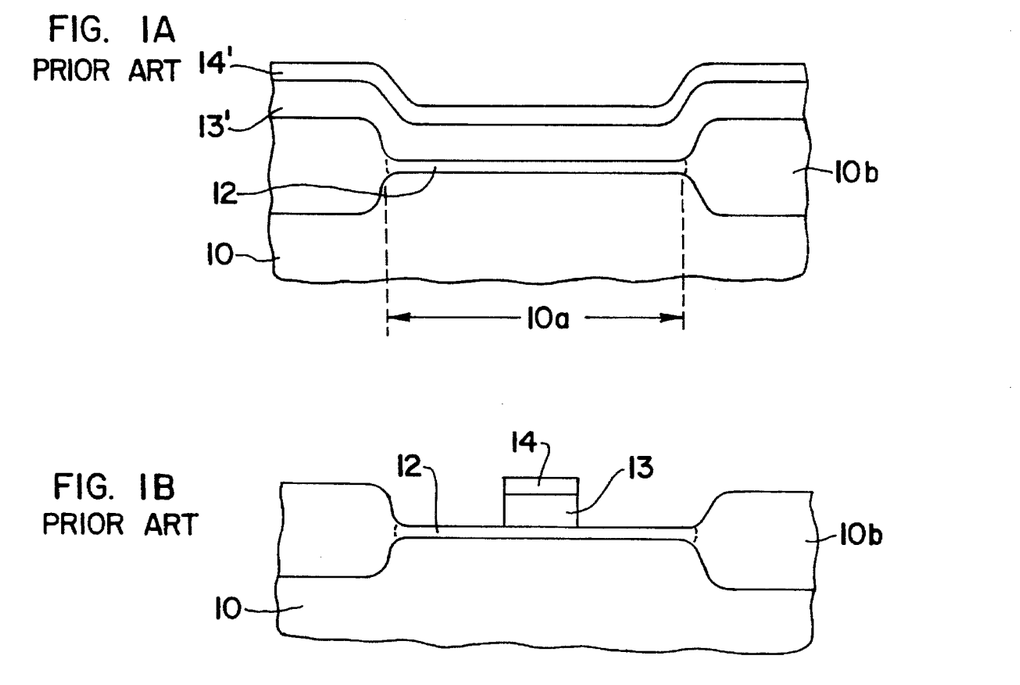
FIGS. 1A–1F illustrates a process for formation of an NMOS transistor having an LDD structure based on a conventional technique.

First referring to FIG. 1A, active region 10a and isolated region 10b are formed upon silicon substrate 10. Gate insulating layer 12 is formed on the surface, and polysilicon layer 13' is formed thereupon. Cap gate oxide layer 14' is formed on polysilicon layer 13'.

As illustrated in FIG. 1B, cap gate oxide layer 14' and polysilicon layer 13' are etched by applying a photo etching method, thereby forming gate (electrode) 13 over which is oxide layer 14.

Figure 1C:
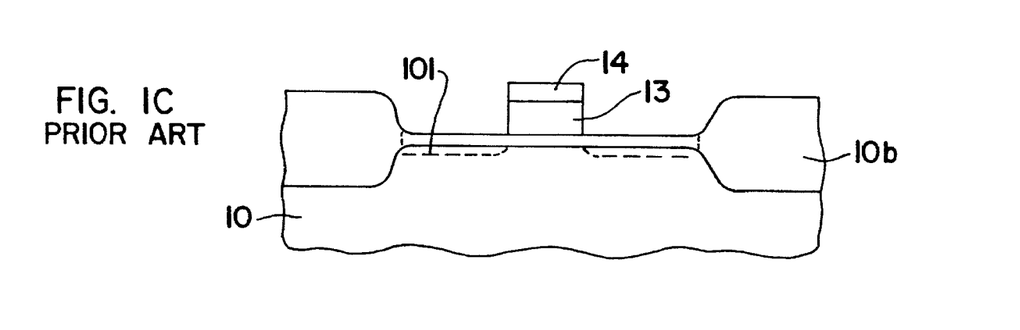

As illustrated in FIG. 1C, an ion-implantation (phosphorus ion) is carried out on the whole surface with a light dose and with a low implanting energy to form $n^-$ region 101.

Figure 1D:
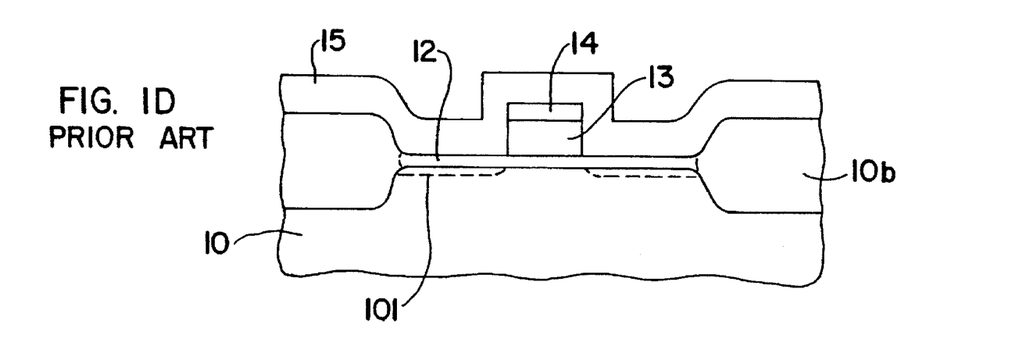

As illustrated in FIG. 1D, silicon oxide layer 15 is deposited on the whole surface by applying a chemical vapor deposition method (CVD) in order to form side wall spacers.

Figure 1E:
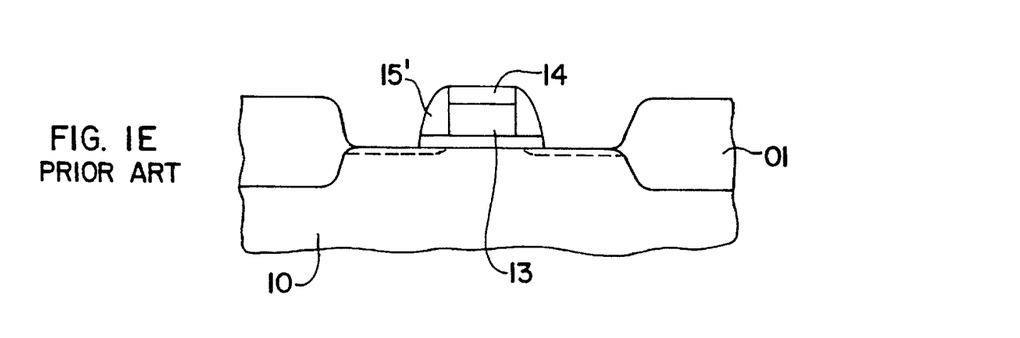

Thereafter, as illustrated in FIG. 1E, the whole surface is etched back by applying a reactive ion etching (RIE) process so that a part of silicon oxide layer 15 remains on the side faces of cap gate oxide layer 14 and gate 13. In this process, gate insulating layer 12 which is not protected by the gate also is etched, thereby exposing the surface of the silicon substrate. Thus, side wall spacer 15' consisting of a part of silicon oxide layer 15 and a part of gate insulating layer 12 is formed on the side walls of cap gate oxide layer 14 and gate 13.

Figure 1F:
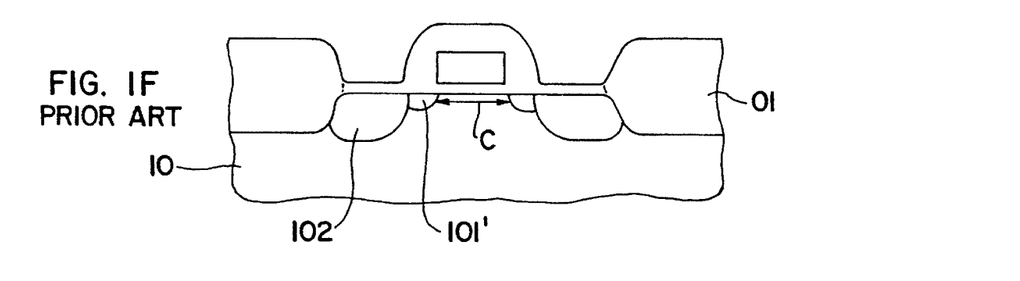

Thereafter, as illustrated in FIG. 1F, an n-type dopant ion implantation is carried out with a large dose, thereby forming source/drain region 102 doped ($n^+$) with a high concentration and having a deep junction. Under this condition, gate side wall spacer 15' plays the role of a barrier during the high concentration ion implantation for forming the source/drain region. Therefore, $n^-$ junction 101', which is not affected by the high concentration doping, if formed between channel C of the gate and source/drain region 102. (Refer to Paul J. Tsang et al, "Fabrication of High Performance LDDFET's with Oxide Sidewall-Spacer Technology" IEEE Transactions on Electron Devices, Vol. ED-29, No. 4, April 1982).

There are, however, several problems in forming LDD devices by providing gate side wall spacers. Particularly, this technology is not suitable for future formation of semiconductor devices requiring high density and high reliability.

In this technique, in order to form a gate side wall spacer, deposition of an oxide is carried out by applying a CVD method, followed by an etch-back. Therefore, during this etching, the active region of the silicon substrate is exposed, and contaminated. Further, the active region of the silicon substrate is over-etched, thereby damaging the silicon substrate. Further, the over-etched depth is not uniform over the positions of the silicon wafer in accordance with the density of the patterns and, therefore, the electrical characteristics of the semiconductor device become non-uniform.

Figure 2:
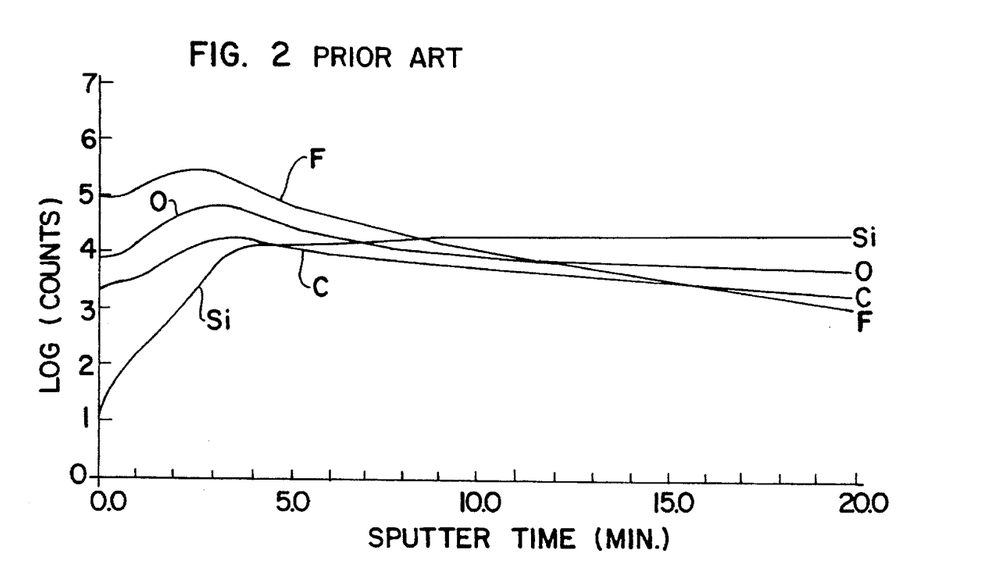

That is, as illustrated in FIG. 2, plasma radical species such as $CF_3$, $CHF_3$ and $O_2$ used during the etching of the oxide layer intrude into the silicon substrate. Therefore, although varying depending on the RF power during etching, a compound layer of about 500 Å is formed, the compounds including $CF_x$-polymers, Si-C, Si-O, Si-O-C.

FIG. 2 is a graphical illustration of the results of analysis using a secondary ion mass spectroscopy (SIMS) for the case where the plasma radical species intrude into the silicon substrate to contaminate the substrate during the etching of the oxide layer by using CF3, CHF3, $O_2$ and the like based on the conventional technique.

In the graph, the X axis illustrates the depth from the silicon surface, i.e., the value of the projection range as against the sputtering time, while the Y axis illustrates the concentration without unit in relative terms and in a logarithmic value. As can be seen from the graph, the concentrations of fluorine, oxygen and carbon near the surface of the silicon are higher than the concentration of the silicon and, therefore, these elements form a compound layer of about 500 Å from the surface, the compounds being such as $CF_x$-polymers, Si-C, Si-O, and Si-O-C.

In high density devices requiring a shallow junction, the bonding sites of the above-mentioned compounds exist within a depletion region when power is applied to the junction. Therefore, such bonding sites serve the role of a trap center for generating carriers, resulting in an increase in junction leakage current.

Figure 3:
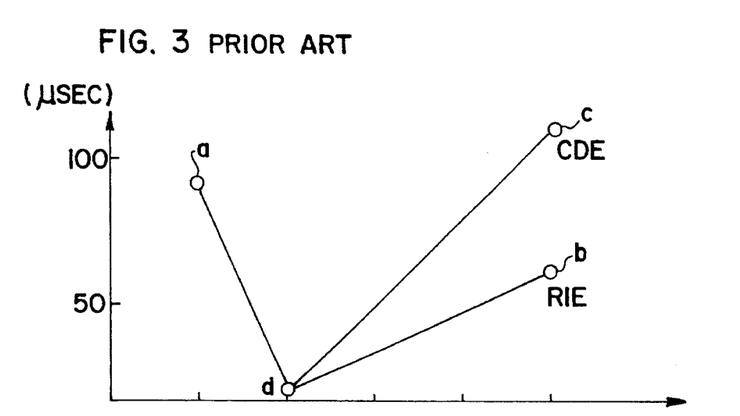
FIG. 3 is a graphical illustration of the variation of the lifetime of the minority carriers according to various etch processes of the side wall oxide.
Figure 4:
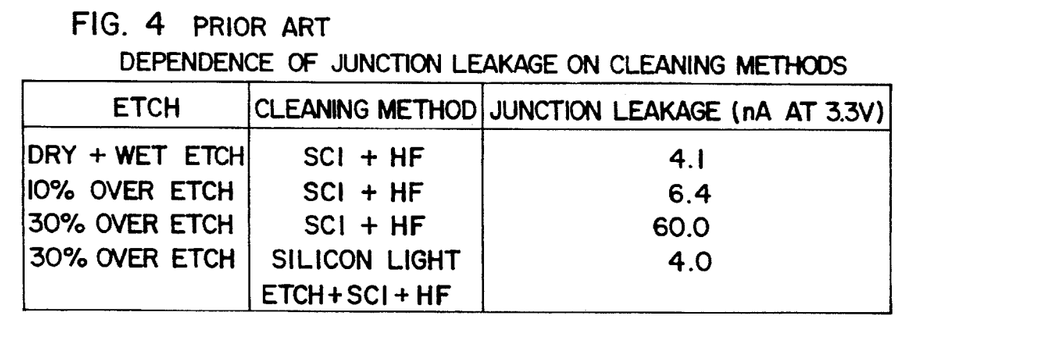
FIG. 4 is a table illustrating the dependence of junction leakage current on various cleaning methods during formation of the gate side wall spacer.

These findings are disclosed in Jeong Kim et al., "Cleaning Process for Removing of Oxide Etch Residue," Proceedings of Contamination Control and Defect Reduction in Semiconductor Manufacturing I, pp. 408–415, 1992, Toronto, and are summarized in FIG. 3 and FIG. 4 (table 4.)

FIG. 3 is a graphical illustration of the variation of the lifetime of minority carriers (a time during which the minority carriers exist in silicon) according to etch processes of the side wall oxide. As illustrated in FIG. 3, the lifetime of the minority carriers are recovered to the original state of the silicon wafer, that is, about 100 μs, similar to the value before etching it. In FIG. 3, the "a" point indicates a lifetime (minority carrier lifetime) in the raw wafer itself (substrate) prior to etching the oxide side wall process. The "d" point indicates a lifetime in the wafer after etching the oxide side wall process by an RIE (reactive ion etch), thus receiving damage. The "b" point indicates a lifetime in the wafer in which the damaged portion is removed by an RIE process. The "c" point indicates a lifetime in the wafer in which the damaged portion is removed by a CDE (low damage Chemical Dry Si substrate Etch) process. The minority carrier lifetime is reduced to about 10 μs ("d" point) just after the etch of the oxide to form the side wall spacer. The damaged substrate is restored to over 100 μs ("c" point) by carrying out a low damage chemical dry etch. Further, if the damaged substrate is removed by a reactive ion etch (RIE), then the lifetime is improved to over 50 μs ("b" point). That is, if the damaged or contaminated portions are removed, the quality of the silicon substrate is restored to the original level.

FIG. 4 illustrates the dependence of junction leakage current on cleaning methods during formation of the gate side wall spacer. As can be seen from FIG., 4, if the silicon substrate is excessively etched, the damaged region increases, and, therefore, junction leakage also increases. If the etch-damaged or contaminated portions are removed, however, the junction characteristics are improved. In other words, in conventional technology in order to make the junction area beside the gate side wall free from damage, an over etch and low damage chemical dry etch process is required.

There is another problem with the conventional technique. Junction leakages were caused by dislocation lines which are across the junction layer from the side wall edge in MOS devices with an LDD structure.

Figure 5:
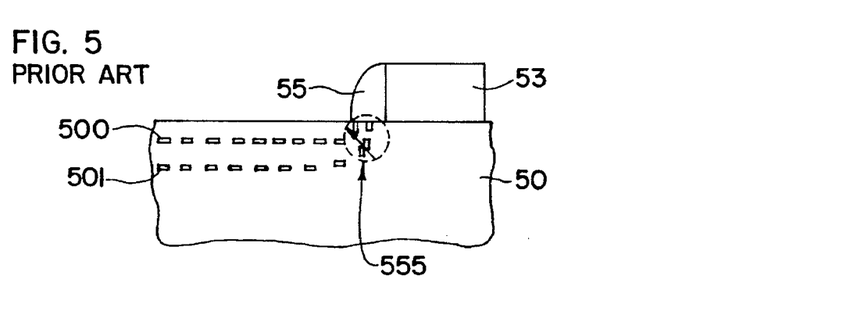
FIG. 5 is a partly sectional view of an NMOSFET having an LDD structure in a conventional semiconductor device.

As illustrated in FIG. 5, the gate side wall spacer is generally formed almost vertical relative to the silicon substrate and, therefore, the stress is concentrated on the corner where the side wall spacer meets the silicon substrate. Therefore, as indicated by dislocation line 555, which is formed from the corner of the spacer to the bulk of the substrate, a crystal defect is formed. This dislocation line increases the leakage current of the junction, and the data retention property is aggravated.

FIG. 5 is a sectional view of a MOSFET having an LDD structure and a silicon dioxide gate side wall spacer in the conventional semiconductor device.

Dislocation loops 500 and 501 which are formed during an $As^+$ ion implantation and subsequent annealing appear on silicon substrate 50 in the form of a loop. Crystal defect 500 of the upper layer is positioned at the depth center $R_p$ of the impurity ions, while crystal defect 501 of the lower layer is positioned at a boundary depth between the non-crystalline and crystalline portions. Particularly, stress generated by differences in thermal properties is concentrated on the corners of side wall spacer 55 of gate 53, with the result that a crystal defect is generated as indicated by dislocation line 555.

It is predicted that such a crystal defect is caused when the thermal stress becomes larger than the silicon bonding energy. Therefore, as illustrated in FIGS. 6A and 6B, the distribution of the stress becomes different in accordance with the shape of the gate side wall spacer.

Figure 6A:
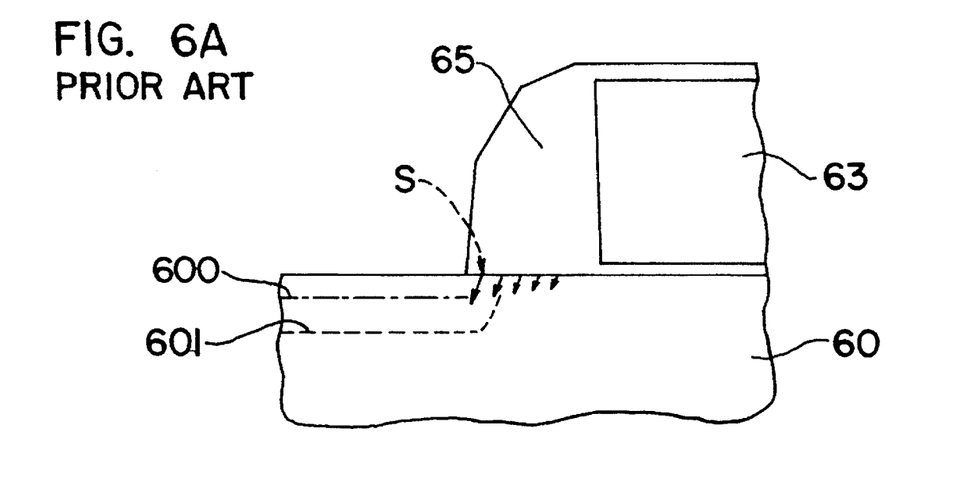
FIGS. 6A–6B illustrates the distribution of the stress from the gate side wall to the silicon substrate for an NMOSFET having an LDD structure in a conventional semiconductor device.
Figure 6B:
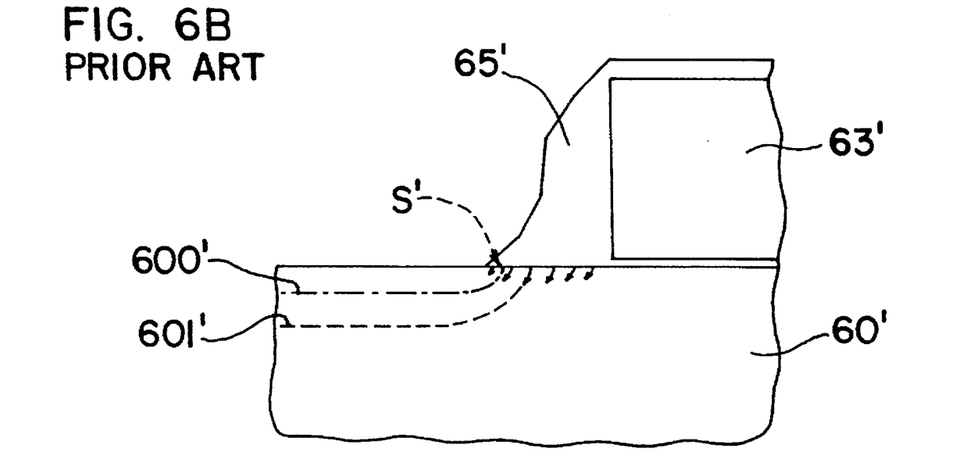

FIGS. 6A and 6B illustrate the stress distribution from the gate side wall spacer to the silicon substrate of an NMOSFET having an LDD in a conventional semiconductor device.

Referring to FIG. 6A, a crystal defect in impurity diffusion layers 600 and 601 results from side wall spacer 65 due to the difference between the thermal expansion rates of silicon substrate 60 and gate side wall oxide layer 65. When the steeply shaped side wall is formed, the stress is concentrated at the side wall edge and indicates a value of about $5.4 \times 10^9$ dyn/cm$^2$. This stress exceeds the bonding energy of the crystal, thereby leading to defect "S" in FIG. 6A. That is, the magnitude of the stress becomes larger than the silicon bonding energy, with the result that dislocation "S" occurs.

Referring to FIG. 6B, if the side wall spacer is less steeply shaped, the stress is concentrated at the side wall edge and indicates a value of about $2.7 \times 10^9$ dyn/cm$^2$. Thus a defect depicted "S'" in FIG. 6B occurs only a little. Here also side wall spacer 65' at gate 63' affects diffusion layers 600' and 601' due to thermal expansion differences between silicon substrate 60' and gate side wall oxide layer 65'.

In short, the stress imposed on the silicon substrate is varied within the range of about $2.7 \times 10^9$–$5.4 \times 10^9$ dyn/cm$^2$ in accordance with the shape of the gate side wall spacer and the angle between the spacer and the substrate. The steeper the side wall spacer relative to the substrate, the more frequent the crystal defect, i.e., the more frequent the dislocation. (Refer to Shigeo Onishi et al., "Formation of a Defect Free Junction Layer by Controlling Defects Due to $As^+$ Implantation" IEEE/ERPS, 1991, pp. 255–259.)

Figure 8:
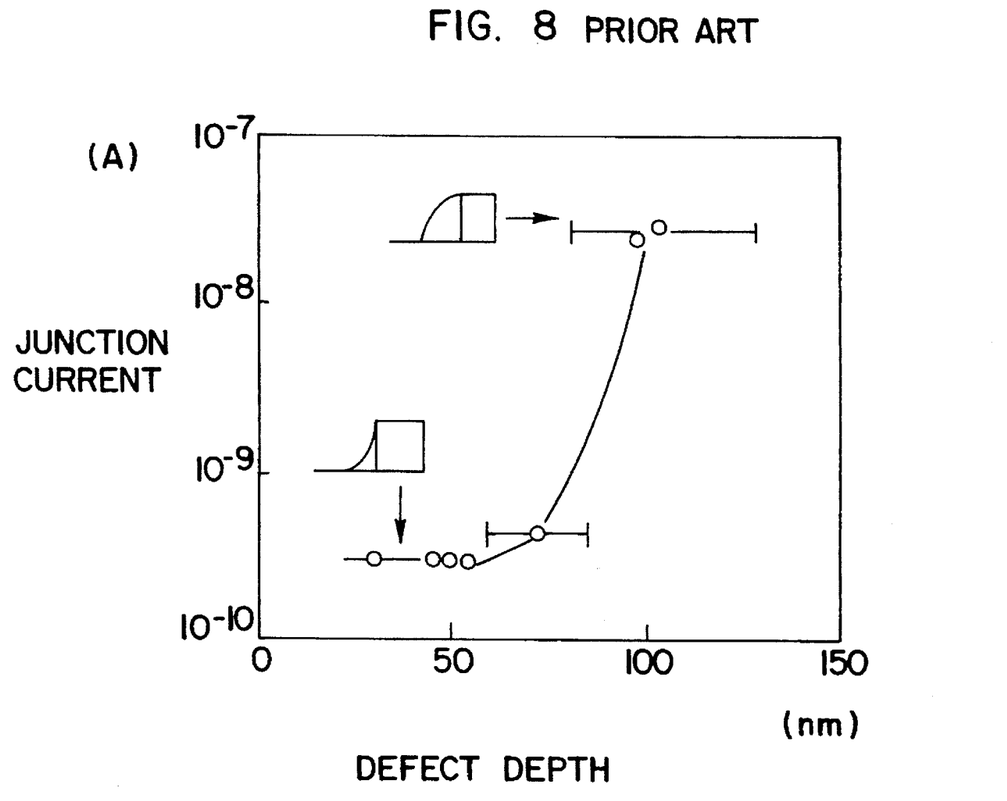
FIG. 8 illustrates junction leakage current versus the dislocation line depth in the substrate.

FIG. 8 is a graphical illustration of the junction leakage current versus dislocation depth in the side wall spacer.

The X axis illustrates the depth of the dislocation line based on the profile of the conventional gate side wall spacer, while the Y axis illustrates the magnitude of the leakage current. It is seen that the greater the steepness of the side wall spacer, the greater the leakage current.

As the size of the device is scaled down, the acceptable tolerance is reduced. Therefore, there are still unsolved problems in that plasma species intrude into the substrate during deposition of the oxide layer based on a CVD process (which is the critical step in the formation of the gate side wall spacer), and during the etching due to the over-etch. Another problem is the degradation of the device characteristics (such as leakage current at the junction layer) due to the crystal defect such as dislocations attributed to the profile of the side wall spacer. Therefore, a study is being carried out for improving the manufacturing process for an LDD device utilizing a conventional side wall spacer.

Also another study is being carried out for obtaining a solution to the problems of forming an LDD device utilizing the side wall spacer based on a substitution method.

Figure 7A:
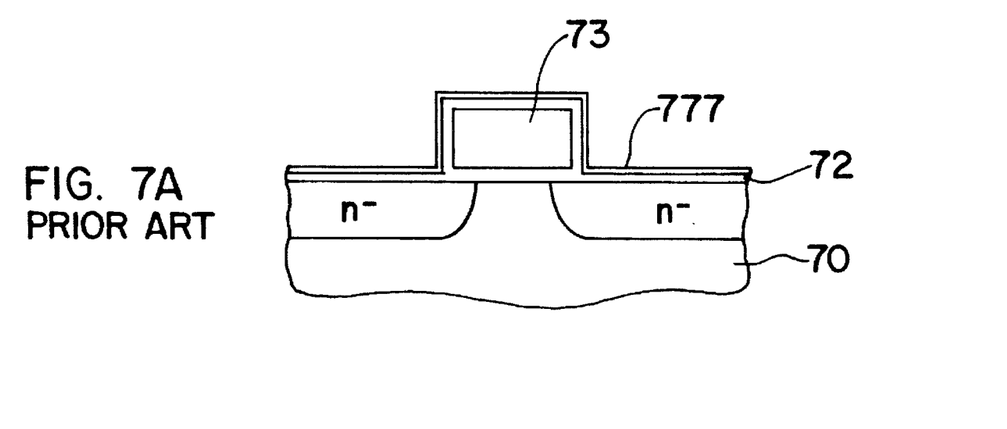
FIGS. 7A–7C illustrates a process for formation of an LDD transistor using a side wall spacer and adding an etch stop layer as an improvement of the conventional techniques.
Figure 7B:
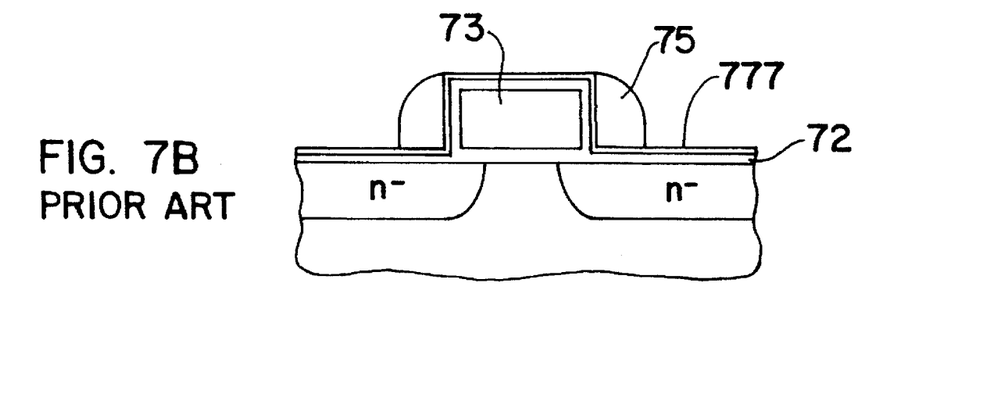
Figure 7C:
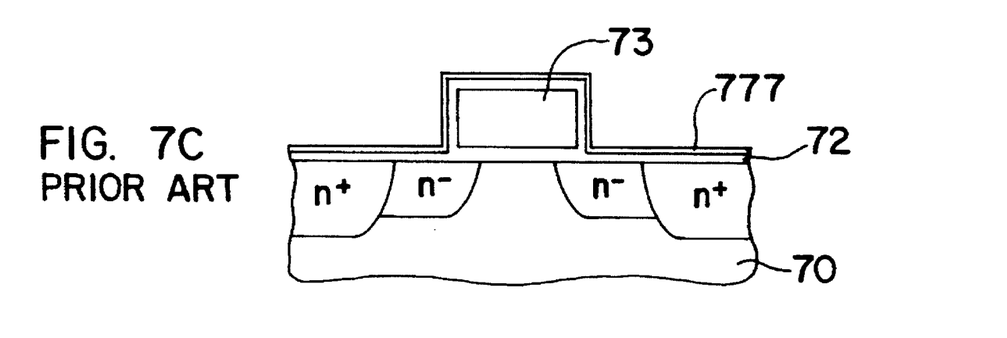

FIGS. 7A to 7C illustrate an improvement of the conventional technique of forming an LDD transistor by adding an etch stop layer and utilizing a side wall spacer.

As illustrated, gate 73 is patterned, and etch stop layer 777 (polysilicon or Si3N4) is formed on gate insulating and pad oxide layer 72 to protect silicon substrate 70 during etchback of CVD $SiO_2$ for forming side wall spacer 75. Then CVD $SiO_2$ 75 is deposited and etched back, so that an excessive etch of the silicon substrate and contamination of the etchant with plasma species are prevented. In the last step illustrated in FIG. 7C, in order to form a highly doped impurity region n+, an ion implantation is carried out after removing spacer 75.

This conventional technique, however, cannot give a solution to the problem of the defect of crystal dislocation which is caused by the profile of the side wall spacer.

Another method suggested in U.S. Pat. No. 4,599,118 is an overhang technique where a stacked structure of $SiO_2$/Si3N4/polysilicon/$SiO_2$ is gate-patterned and the polysilicon is excessively etched, thereby forming an $SiO_2$/Si3N4 overhang. An $As^+$ source/drain ion implantation is carried out using the overhang as an ion implantation mask, and the overhang is removed in order to carry out an $n^-$ ion implantation for forming an $n^-$ region.

In brief, the scaled-down transistors come to have short channels, with the result that hot carriers are produced, thereby raising the problem of hot carrier instability. In order to overcome this problem, a transistor having an LDD has been proposed, and in the practical fields, the LDD was formed utilizing a gate side wall spacer. In high density devices of over 16 mega-bit DRAMs, however, the LDD device formed by utilizing a side wall spacer has become unsuitable for the reasons cited above.

SUMMARY OF THE INVENTION

According to the present invention, a MOSFET with an LDD structure is formed without a side wall spacer, thereby solving problems caused by the side wall spacer.

It is an object of the present invention to provide a process for forming a MOS semiconductor device having an LDD structure which is suitable for a VLSI (very large scale integrated circuit), and in which the above described disadvantages of the conventional techniques are overcome.

In the present invention, the LDD structure is formed without using a side wall spacer as an ion implantation inhibition layer.

In achieving the above object, a process for forming an LDD MOSFET according to the present invention includes the steps of: forming a first insulating layer on a semiconductor substrate after forming an active region and an isolation region in accordance with a general CMOS device formation process; forming a conductive layer on the first insulating layer; forming a second insulating layer on the conductive layer; forming a third insulating layer on the second insulating layer; forming an etch inhibiting layer pattern for forming an over-sized gate on the relevant area of the second insulating layer; removing the second and third insulating layers and the conductive layer excluding the portions protected from the etch inhibiting layer, so as to form a stacked pattern consisting of the residual second insulating layer/the third insulating layer/the conductive layer; forming a first impurity ion buried layer for a source/drain region on the relevant portion of the semiconductor substrate utilizing the stacked pattern; removing the etch inhibiting layer; removing the relevant portion of the remaining second insulating layer of the stacked pattern from a side for forming the final gate; removing the residual third insulating layer of the stacked pattern; etching the residual conductive layer by using the partly removed second insulating layer as the mask to form the final gate; forming a second impurity ion buried layer on the relevant portion of the semiconductor substrate for forming an LDD structure; forming a fourth insulating layer on the whole surface of the wafer; and activating the first and second ion buried layers.

In achieving the above object, a process according to the present invention includes the steps of: forming a first insulating layer on a semiconductor substrate; forming a conductive layer on the first insulating layer; forming an upper layer composed of a material having an etch selectivity with silicon oxide and a reactivity with polysilicon on the conductive layer; forming a third insulating layer on the upper layer; forming an etch inhibiting layer for forming an over-sized gate on the relevant portion of the surface of the upper layer; removing the upper layer, the third insulating layer and the conductive layer except the portions protected by the etch inhibiting layer so as to form a stacked pattern consisting of the remaining portions of the upper layer/the third insulating layer/the conductive layer; forming a first impurity ion buried layer on the relevant portion of the semiconductor substrate for a source/drain region utilizing the stacked pattern; removing the etch inhibiting layer; removing the remaining portion of the upper layer of the stacked pattern from a side for forming a final gate; removing the remaining portion of the third insulating layer of the stacked pattern; etching the residual conductive layer of the stacked pattern by using the partly removed upper layer as the mask to form the final gate; forming a second impurity ion buried layer on the relevant portion of the semiconductor substrate for forming an LDD structure; forming a fourth insulating layer on the whole surface of the wafer; and activating the first and second impurity ion buried layers.

BRIEF DESCRIPTION OF THE DRAWINGS

The above object and other advantages of the present invention will become more apparent by describing in detail the preferred embodiments of the present invention with reference to the attached drawings in which:

FIG. 2 is a graphical illustration of the results of an analysis of an over-etched silicon substrate using SIMS (secondary ion mass spectroscopy) and illustrating the contamination of the silicon substrate by the intruding plasma radicals during the etch of the oxide layer using gases of CF3, CHF3, $O_2$ and the like;

DESCRIPTION OF THE PREFERRED EMBODIMENTS

Referring to FIGS. 9A to 9F, preferred embodiments of the present invention will be explained.

Figure 9A:
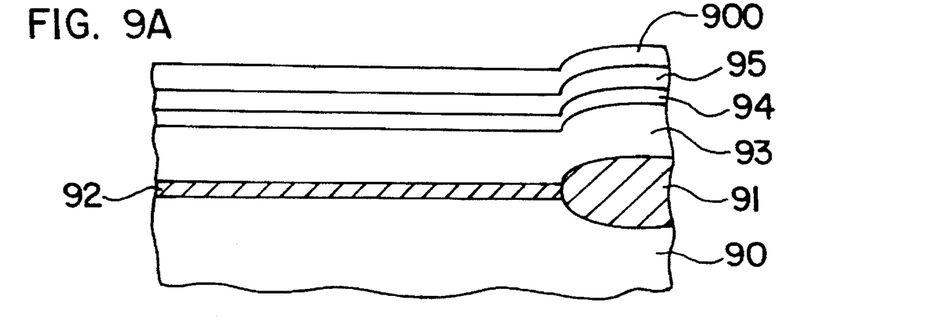
FIGS. 9A to 9F are partly sectional views illustrating a process for forming an MOS field effect transistor having an LDD structure according to the present invention.

As illustrated in FIG. 9A, isolation region 91 and active region (reference numeral not assigned) are formed on silicon substrate 90 by applying a field oxidizing method. First insulating layer 92 which is a gate insulating layer for insulating a gate (to be formed later) is grown to a thickness of about 100 Å from silicon substrate 90.

Conductive layer 93, which may be an in-situ doped polysilicon layer, for forming the gate electrode is deposited on first insulating layer 92 to a thickness of about 2500 Å by applying an LPCVD (low pressure chemical vapor deposition) method. Second insulating layer 94, which may comprise nitride ($Si_3N_4$), is deposited on the conductive layer to a thickness of about 300 Å by applying an LPCVD method. Second insulating layer 94 is chosen to have a large difference in etch rate as compared with the silicon oxide of third insulating layer 95 (to be formed later) and the polysilicon of conductive layer 93.

Third insulating layer 95, which may comprise an oxide layer, is deposited on the polysilicon of conductive layer to a thickness of about 500 Å by applying a CVD method. Photo resist 900 is spread (spin coated) on third insulating layer 95.

Figure 9B:
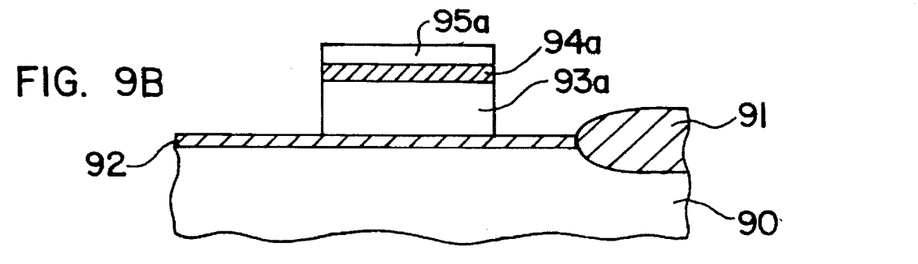

As illustrated in FIG. 9B, a photo resist pattern (not shown) is defined through exposing and developing with a gate forming photo-mask which is slightly over-sized (about 0.1 μm) as compared with the final gate dimension of the final transistor.

Utilizing the photo resist pattern, third insulating layer 95 (which may be CVD oxide layer) and second insulating layer 94 (which may be a nitride layer) which are not protected by the photo resist pattern are removed by carrying out an anisotropic etching. Utilizing the same photo resist pattern, the polysilicon of conductive layer 93 is etched until first insulating layer 92 (gate insulating layer) is exposed, thereby forming a stacked pattern (reference code not assigned) consisting of third insulating layer 95a, second insulating layer 94a and conductive layer 93a which remain after the etching. Under this condition, residual conductive layer 93a comprises an over-sized gate.

Thereafter, the photo resist is removed in a usual manner.

Figure 9C:
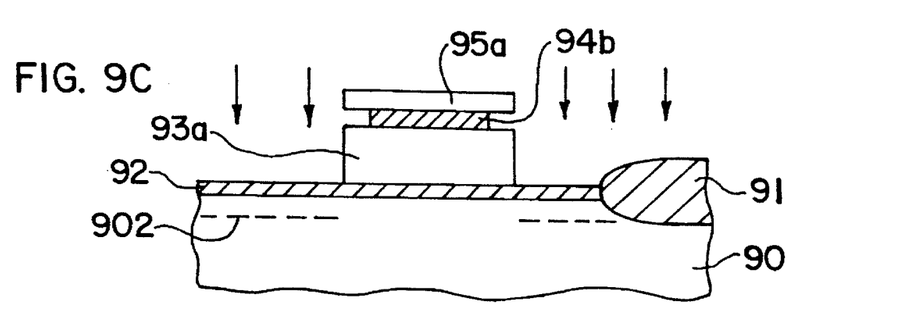

As illustrated in FIG. 9C, a first ion implantation is carried out for forming a highly doped $n^+$ source/drain region which is to be formed at a subsequent step. By carrying out the first ion implantation using $As^+$ ions, first impurity region (ion buried layer) 902 is formed in the active region of the semiconductor substrate.

The stacked pattern which is formed at the previous step serves as an ion implantation inhibiting layer. Further, it is over-sized by about 0.2 μm (0.1 μm on each side) and, therefore, the first impurity ion buried layer is not formed under the oversized gate in order to become an LDD region at a subsequent step. Thus, according to the present invention, a side wall spacer is not utilized during the formation of the source/drain region. Therefore, the degradation of the device characteristics due to the physical deterioration of the various elements as described with reference to FIGS. 2 to 6 can be prevented. That is, the problems of contamination of the substrate, the generation of a dislocation line due to stress, and the consequent leakage current at the junction are solved. Further, the problem which was described with reference to FIG. 7, i.e., the problem of the dislocation line, is solved.

A wet etching is carried out using an $H_3PO_4$ solution having a temperature of about 160° C. to etch the stacked pattern of the residual second insulating layer (item 94a in FIG. 9B) (which may comprise $Si_3N_4$), so that it is recessed to about as much as gate 93a is over-sized (i.e., about as much as 0.1 μm on each side). In order to form such recessed second insulating layer 94b, the second and third insulating layers and the conductive layer have to be composed of materials having different etch selectivities. The amount of the removed material under this condition is as much as gate 93a is oversized (0.1 μm on the both sides), if the length of the final gate of the transistor is to be formed. The reason is that the nitride layer pattern of the residual second insulating layer initially has the same length as that of oversized gate 93a. Recessed second insulating layer 94b serves as an ion implantation inhibiting layer later during a second ion implantation, and also serves as an etch mask during the formation of the final gate electrode.

Figure 9D:
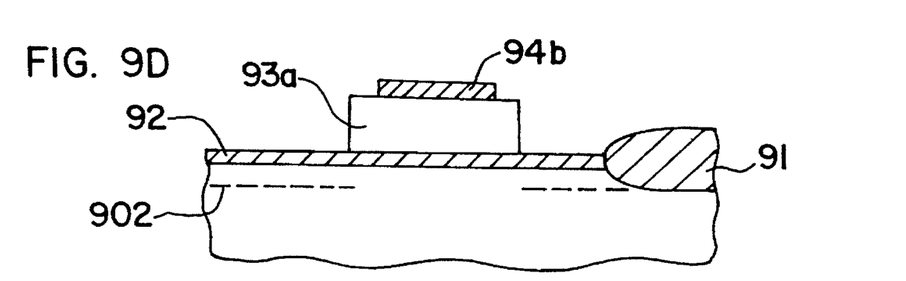

As illustrated in FIG. 9D, the residual uppermost layer, i.e., residual third insulating layer 95a, is removed, so that recessed second insulating layer 94b may serve as an etch inhibiting layer during formation of the final gate.

Figure 9E:
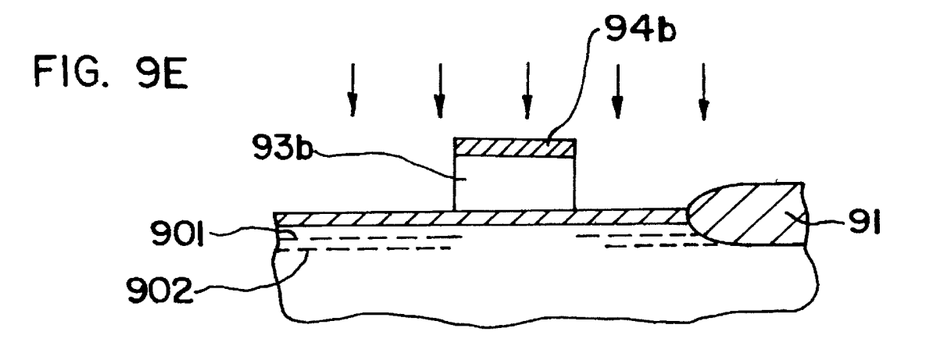

As illustrated in FIG. 9E, over-sized gate 93a is anisotropically etched using recessed second insulating layer 94b as a mask, thereby forming final gate 93b.

In order to form a lightly doped drain (LDD) structure, a second ion implantation is carried out on the whole surface of the semiconductor substrate using phosphorus ions, thereby forming second impurity region (ion buried layer) 901. In the case of an NMOSFET, the second impurity ion buried layer is formed using phosphorus ions and a concentration of about $5.0 \times 10^{12} - 5.0 \times 10^{13}$ ions/cm². In the case of a PMOSFET, the ions used are $B^+$ or $BF^+$ and the ion concentration is about $5.0 \times 10^{12} - 5.0 \times 10^{13}$ ions/cm².

Figure 9F:
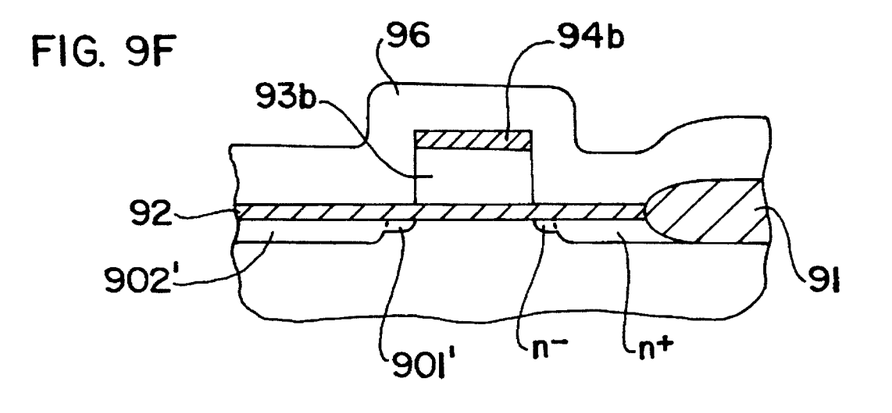

As illustrated in FIG. 9F, an oxide layer is deposited on the whole surface of the wafer by applying a CVD method to form fourth insulating layer 96.

In order to activate the last implanted ions and to form a source/drain junction, an annealing is carried out at a temperature of about 870° C. for about 40 minutes, so that the ions of the first and second impurity buried layers should be sufficiently diffused. Thus, LDD junction 901' and source/drain junction 902' are formed, thereby completing formation of the LDD MOSFET according to the present invention.

Particularly, if the present invention is applied to the formation of a MOS device having a polycide gate, a greater advantage is gained. That is, a highly doped n-type source/drain region is defined using an over-sized gate pattern, and when a sidewise recessed pattern is to be formed by wet-etching the length of the gate of the transistor from the sides, metals (such as Ti, W, Ta, Co, Mo) which reacts with silicon to form a silicide are used instead of the second insulating layer, thereby depositing it by applying a CVD method. In this case or in the case of using other metal compounds such as TiN, ZrN or the like, an LDD device can be easily formed without carrying out additional steps.

In this case, the recessed pattern is removed by being wet-etched within an $NH_4OH/H_2O_2$ solution.

According to the present invention as described above, the problems of the conventional techniques which arise during etching of the oxide layer for forming the side wall spacer are all addressed. That is, problems such as the excessive etching causing the non-uniformness of the silicon substrate, the contamination of the substrate by the intrusion of the plasma species during the etching of the oxide layer, and the consequent degradation of the device characteristics, and the like are not presented with the present invention. Particularly, the generation of the dislocation line which is caused by the stress due to the profile of the gate side wall spacer can be eliminated with the present invention. Further, in the case where a metal silicide is used between the polysilicon and the CVD oxide layer, a low resistivity polycide gate electrode can be formed without carrying out additional steps.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for forming a MOSFET having an LDD structure, comprising the steps of:
   (1) forming a first insulating layer on a semiconductor substrate;
   (2) forming a conductive layer on the first insulating layer;
   (3) forming a second insulating layer on the conductive layer;
   (4) forming a third insulating layer on the second insulating layer;
   (5) selectively removing portions of the third insulating layer, the second insulating layer and the conductive layer to form a stacked over-sized gate pattern;
   (6) forming a first impurity region in the semiconductor substrate utilizing the stacked over-sized gate pattern as a mask;
   (7) selectively removing an edge portion of the second insulating layer with a wet etch from the stacked over-sized gate pattern to form an undercut with respect to the third insulating layer;
   (8) removing the third insulating layer;
   (9) etching the conductive layer using the second insulating layer as a mask to form a gate; and
   (10) forming a second impurity region in the semiconductor substrate.

2. The process of claim 1, further comprising:
   (1) forming a fourth insulating layer; and
   (2) activating the first and second impurity regions.

3. The process of claim 1, wherein the first insulating layer comprises silicon dioxide formed by thermal oxidation.

4. The process of claim 1, wherein the conductive layer comprises in-situ doped polysilicon.

5. The process of claim 1, wherein the second insulating layer comprises silicon nitride and is formed to a thickness of about 500 Å.

6. The process of claim 1, wherein the third insulating layer comprises silicon oxide formed by a CVD method.

7. The process of claim 1, wherein the second and third insulating layers comprise materials having different etch rates.

8. The process of claim 1, wherein the stacked over-sized gate pattern has a length longer by about 0.2 μm, about 0.1 μm on each side, as compared with the length of the gate.

9. The process of claim 1, wherein the stacked over-sized gate pattern is formed by sub-steps comprising selectively patterning the third insulating layer and the second insulating layer, and selectively etching the conductive layer.

10. The process of claim 1, wherein the first impurity region is formed by carrying out an ion implantation using $As^+$ ions at a dose of about $1.0 \times 10^{15}$–$1.0 \times 10^{16}$ ions/cm$^2$.

11. The process of claim 1, wherein the wet etching is carried out to remove from the edge of the second insulating layer up to about 0.1 micrometers and comprises dipping into a phosphoric acid solution.

12. The process of claim 1, wherein the second impurity region is formed by carrying out an ion implantation using phosphorus ions at an ion dose of about $5.0 \times 10^{12}$–$5.0 \times 10^{13}$ ions/cm$^2$.

13. The process of claim 1, wherein the first impurity region is formed by carrying out an ion implantation using $B^+$ or $BF^+$ ions at a dose of about $1.0 \times 10^{15}$–$1.0 \times 10^{16}$ ions/cm$^2$.

14. The process of claim 1, wherein the second impurity region is formed by carrying out an ion implantation using $B^+$ or $BF^+$ ions at an ion dose of about $5.0 \times 10^{12}$–$5.0 \times 10^{13}$ ions/cm$^2$.

15. The process of claim 2, wherein the activation of the impurity ions comprises annealing at a temperature of about 870° C. for about 40 minutes.

16. A process for manufacturing a semiconductor device, comprising the steps of:
   (1) forming a first insulating layer on a semiconductor substrate;
   (2) forming a conductive layer on the first insulating layer;
   (3) forming an upper layer on the conductive layer, wherein the upper layer comprises a material having a different etch rate as compared with the first insulating layer and the conductive layer;
   (4) forming a second insulating layer on the upper layer, wherein the second insulating layer comprises a material having a different etch rate as compared with the upper layer;
   (5) selectively removing portions of the second insulating layer, the upper layer and the conductive layer to form a stacked over-sized gate pattern;

(6) forming a first impurity region in the semiconductor substrate utilizing the stacked over-sized gate pattern as a mask;

(7) selectively removing an edge portion of the upper layer with a wet etch to form an undercut with respect to the second insulating layer;

(8) removing the second insulating layer;

(9) etching the conductive layer using the upper layer as a mask to form a gate; and (10) forming a second impurity region in the semiconductor substrate.

17. The process of claim 16, further comprising the steps of:

(1) forming a third insulating layer; and (2) activating the first and second impurity regions.

18. The process of claim 16, wherein the upper layer comprises a metal for forming a silicide.

19. The process of claim 16, wherein the upper layer comprises a silicide.

20. The process of claim 16, wherein the wet etch is carried out to remove the edge portion of the upper layer up to about 0.1 micrometers and comprises dipping into an $NH_4OH/H_2O_2$ solution.

21. The process of claim 16, wherein the stacked over-sized gate pattern has a length about 0.2 micrometers greater than the length of the gate.

* * * * *